(12) United States Patent
Hodrinsky et al.

(10) Patent No.: US 8,796,724 B2
(45) Date of Patent: Aug. 5, 2014

(54) LIGHT EMITTING SYSTEMS AND METHODS

(76) Inventors: Todd W Hodrinsky, Mansfield Center, CT (US); Donald T Wesson, Jr., Ashford, CT (US); Deborah D Cebry, Burlington, CT (US); Matthew D Gidman, Willin, CT (US); Robert M Sarazin, Marlborough, CT (US)

(*) Notice: Subject to any disclaimer, the term of this patent is extended or adjusted under 35 U.S.C. 154(b) by 58 days.

(21) Appl. No.: 13/332,342

(22) Filed: Dec. 20, 2011

(65) Prior Publication Data
US 2013/0153935 A1   Jun. 20, 2013

(51) Int. Cl.
H01L 33/00 (2010.01)
H01L 29/18 (2006.01)
H01L 29/40 (2006.01)
H01L 21/00 (2006.01)
H01L 33/62 (2010.01)

(52) U.S. Cl.
CPC ....... *H01L 33/62* (2013.01); *H01L 2224/32225* (2013.01)
USPC ........ 257/99; 257/88; 257/783; 257/E21.515; 438/26

(58) Field of Classification Search
CPC ..... H01L 24/00; H01L 33/62; H01L 2924/00; H01L 2924/00014; H01L 2224/48091; H01L 2224/32225; H05K 2201/10674; H05K 3/305
USPC ........ 257/81, 88, 98, 99, 100, 259, 707, 753, 257/783, E21.515, E33.061, E33.064; 438/25, 26, 228, 628, 644
See application file for complete search history.

(56) References Cited

U.S. PATENT DOCUMENTS

| | | | |
|---|---|---|---|
| 5,843,251 A * | 12/1998 | Tsukagoshi et al. | ............ 156/64 |
| 7,982,226 B2 | 7/2011 | Lee et al. | |
| 2005/0151136 A1 | 7/2005 | Liu | |
| 2007/0290217 A1 * | 12/2007 | Daniels | ............. 257/88 |
| 2008/0017870 A1 | 1/2008 | Diamantidis | |
| 2008/0080163 A1 * | 4/2008 | Grote, III et al. | ............... 362/23 |
| 2011/0204391 A1 | 8/2011 | Lerman et al. | |
| 2011/0215342 A1 | 9/2011 | Oliver | |

FOREIGN PATENT DOCUMENTS

WO   2011018689   2/2011

* cited by examiner

*Primary Examiner* — Fernando L Toledo
*Assistant Examiner* — Aaron Gray
(74) *Attorney, Agent, or Firm* — Ilya Libenzon

(57) ABSTRACT

This invention is about a reliable light-emitting system and a method to make it. The light-emitting system is mounted on a carrier with a non-conductive adhesive such that at least one of the p-contact layer and n-contact layer of the light-emitting device is in direct contact with conductive patterns formed on the carrier.

22 Claims, 7 Drawing Sheets

Method of fabricating an LED system

Method of fabricating an LED system

LIGHT EMITTING SYSTEMS AND METHODS

TECHNICAL FIELD

The invention relates to light-emitting systems and related methods.

BACKGROUND

A light emitting diode (LED) often can provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers determine the wavelength(s) of light emitted by the LED. In addition, the chemical composition of the layers can be selected to try to isolate injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

A common approach to preparing an LED is as follows. The layers of material are prepared in the form of a wafer. Typically, the layers are formed using an epitaxial deposition technique, such as metal-organic chemical vapor deposition (MOCVD), with the initially deposited layer being formed on a growth substrate. The layers are then exposed to various etching and metallization techniques to form contacts for electrical current injection, and the wafer is subsequently sectioned into individual LED chips. Then the LED chips are packaged. Currently employed packaging methods utilize wire bonding, soldering, metal bumps, as well as ultrasonic thermal bonding using silver, tin, and gold bumps, for example.

FIG. 1 shows an exemplary flip-chip packaging 100 of a light emitting device (LED) die employed in the prior art. The light-emitting structure (multiple-quantum well active region 103 sandwiched between p-doped layer 102 and n-doped layer 104) is grown over sapphire substrate 101. Generated in active region 103, light ray 1 undergoes no total internal reflection and escapes through sapphire substrate 101. Generated in active region 103, light ray 2 is totally internally reflected form n-contact layer 105. Reflected ray 2 can escape through the substrate, and eventually about 30% of all generated light can be extracted. N-contact 105 and p-contact 106 are connected to metal submount 108 by solder 107 making an electrical connection between contact 105, 106 and conductive pattern/circuitry 112 of submount 108. Fabricating such packaging structures is a complicated and costly process. More importantly, however, these prior art packaging schemes are not reliable because solder in general and lead free solders in particular are prone to premature failure due to lack of pliability, as well as due to residual stress and deformation during thermal processing.

SUMMARY

It is therefore an object of the present invention to provide an LED package and related method that result in such a package that is characterized by high reliability.

It is further object of the present invention to provide an LED package and related method that is easy to fabricate.

It is yet further object of the present invention to provide an LED package that is less expensive than the prior art packages.

The subject invention, in one aspect, results from the partial realization that a cheaper, easier to fabricate, and more reliable and compact LED packaging system is effected by eliminating solders, metal bumps, and other metal joints used for connecting an LED device to carriers, and by using a non-conductive adhesive to attached the LED device to a carrier, followed by encapsulation.

In one embodiment, a light-emitting system comprising at least one light-emitting device, with at least one light-emitting device comprising a p-doped region, an n-doped region, an active region disposed between the p-doped region and n-doped region, an n-contact layer disposed on the n-doped layer and a p-contact layer disposed on the p-doped layer; a carrier with conductive patterns disposed thereon forming a circuit for connecting to a power source for operating the at least one light-emitting device, the formed circuit being in electrical communication with the n-contact layer and p-contact layer of the light-emitting device; the at least one light-emitting device is mounted on the carrier with a non-conductive adhesive disposed on the carrier such that at least one of the p-contact layer and n-contact layer of the light-emitting device is in direct contact with the conductive patterns formed on the carrier; wherein the at least one light-emitting device is selected from the group consisting of light-emitting diode, surface mount device (SMD) package incorporating at least one light-emitting diode, integrated circuit incorporating at least one light-emitting diode, or a combination thereof.

In another embodiment, the p-contact layer and said n-contact layer of the light-emitting device are disposed on the same side of the light-emitting device, on the side that is opposite the light emission surface of the light-emitting device.

In one instance, the p-contact layer and n-contact layer of the light-emitting device are disposed on the opposite sides of the light-emitting device.

In some embodiments, a light-emitting system can further comprise a transparent encapsulation layer.

In one example, the light-emitting system can further comprise a light converting phosphor layer.

In one version, the non-conductive adhesive is disposed on the carrier in at least one spot on the perimeter of the light-emitting device.

In another version, the non-conductive adhesive is further disposed to fill in the gaps between said at least one light-emitting device and said carrier.

A method of making a light-emitting system is also provided. According to one embodiment, the method comprising the steps of providing a carrier with conductive patterns disposed thereon forming a circuit for connecting to a power source for operating said at least one light-emitting device; providing at least one light-emitting device comprising a p-doped region, an n-doped region, an active region disposed between said p-doped region and n-doped region, an n-contact layer disposed on the n-doped layer and a p-contact layer disposed on the p-doped layer; placing said at least one light-emitting device on the carrier in such a way as to make at least one of said p-contact layer and said n-contact layer in direct contact with the conductive patterns on the carrier; applying a non-conductive adhesive material on the carrier to attach the light-emitting device to the carrier; and curing said non-conductive adhesive material; wherein the at least one light-emitting device is selected from the group consisting of light-emitting diode, surface mount device (SMD) package incorporating at least one light-emitting diode, integrated circuit incorporating at least one light-emitting diode, or a combination thereof.

According to another embodiment, the p-contact layer and n-contact layer are disposed on the same side of the light-emitting device, on the side that is opposite the light emission surface of the light-emitting device.

In another instance, the p-contact layer and n-contact layer are disposed on the opposite sides of the light-emitting device.

In one version, the method further comprises electrically connecting one of the p-contact and n-contact layers of the light-emitting device to the conductive circuit on the carrier.

In another version, applying the non-conductive adhesive material is performed in at least one spot on the perimeter of the light-emitting device.

In one instance, the method further comprising disposing a transparent encapsulation layer.

In another instance, the method further comprises disposing a light converting phosphor layer.

In one variant, the method further comprises applying the non-conductive adhesive to fill in the gaps between the at least one light-emitting device and the carrier.

In another variant, the method further comprises applying a downward force to the light-emitting device prior to dispensing the non-conductive adhesive.

And yet in another instance, the method further comprises lighting up the light-emitting device by applying voltage to the device prior to curing the non-conductive adhesive to test if the device is functional.

In one example, dispensing the non-conductive adhesive on the carrier is performed prior to placing the at least one light-emitting device on the carrier.

In another example, the method further comprises applying a downward force to the light-emitting device after placing the light-emitting device on the carrier.

And yet in another version, applying the downward force to the light-emitting device is further performed while the adhesive is being cured.

Other aspects, embodiments and features of the invention will become apparent from the following detailed description of the invention when considered in conjunction with the accompanying figures. The accompanying figures are for schematic purposes and are not intended to be drawn to scale. In the figures, each identical or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention.

DESCRIPTION OF DRAWINGS

The preceding summary, as well as the following detailed description of the invention, will be better understood when read in conjunction with the attached drawings. For the purpose of illustrating the invention, presently preferred embodiments are shown in the drawings. It should be understood, however, that the invention is not limited to the precise arrangements and instrumentalities shown.

DETAILED DESCRIPTION

Figure 1:
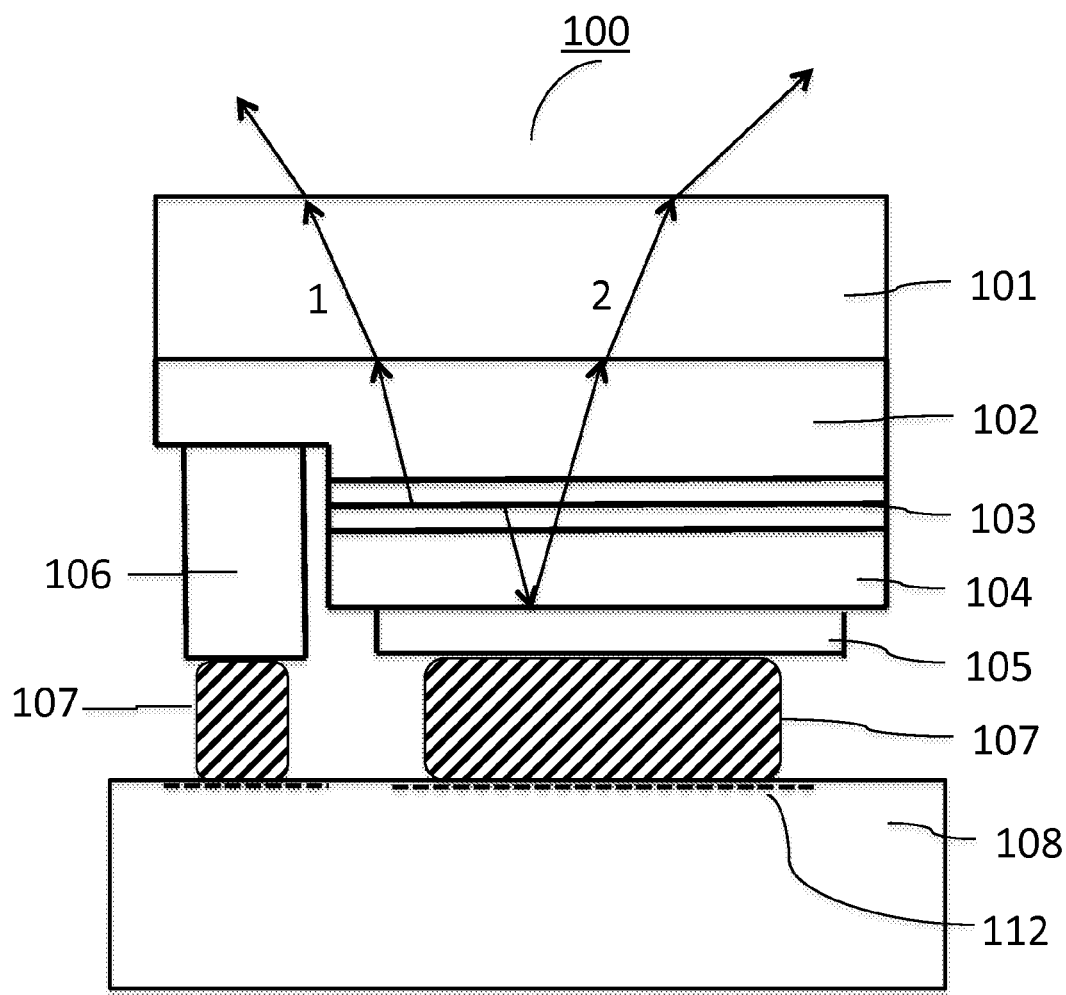
FIG. 1 is a schematic cross-section of an LED chip packaging used in the prior art.
Figure 2:
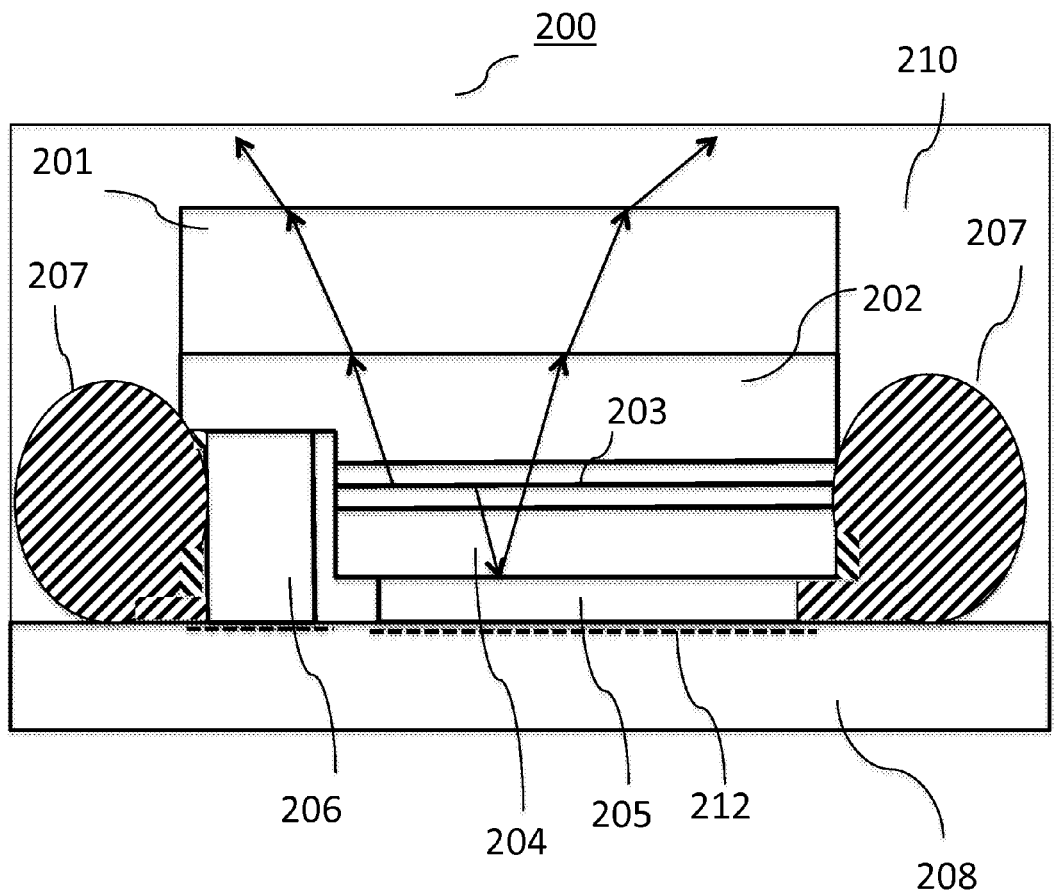
FIG. 2 is a schematic cross-section of a light-emitting system in accordance with one embodiment of the present invention.

One embodiment of the present invention features a light-emitting system illustrated in FIG. 2. Light-emitting system 200 comprises a light-emitting device having p-doped region 202, n-doped region 204, active region 203 sandwiched between these doped regions 202 and 204, n-contact layer 205 disposed on n-doped region 204, and p-contact layer 206 disposed on p-doped layer 202 (p-contact and n-contact are positioned on the same, bottom side of the light-emitting device, on the side opposite the light emission surface of the light-emitting device, which is a top surface of substrate 201), carrier 208 with conductive patterns/circuitry 212, and adhesive 207 disposed on carrier 208, which holds the light-emitting device in contact with carrier 208, which results in electrical communication between n-contact layer 205, p-contact layer 206 and corresponding conductive patterns/circuitry 212 on carrier 208. According to the present invention, the light-emitting system comprises at least one light-emitting device (it can comprise two light-emitting devices, three light-emitting devices, or more light-emitting devices, thus it can comprise an array of light-emitting devices with more than one light-emitting device).

Figure 6:
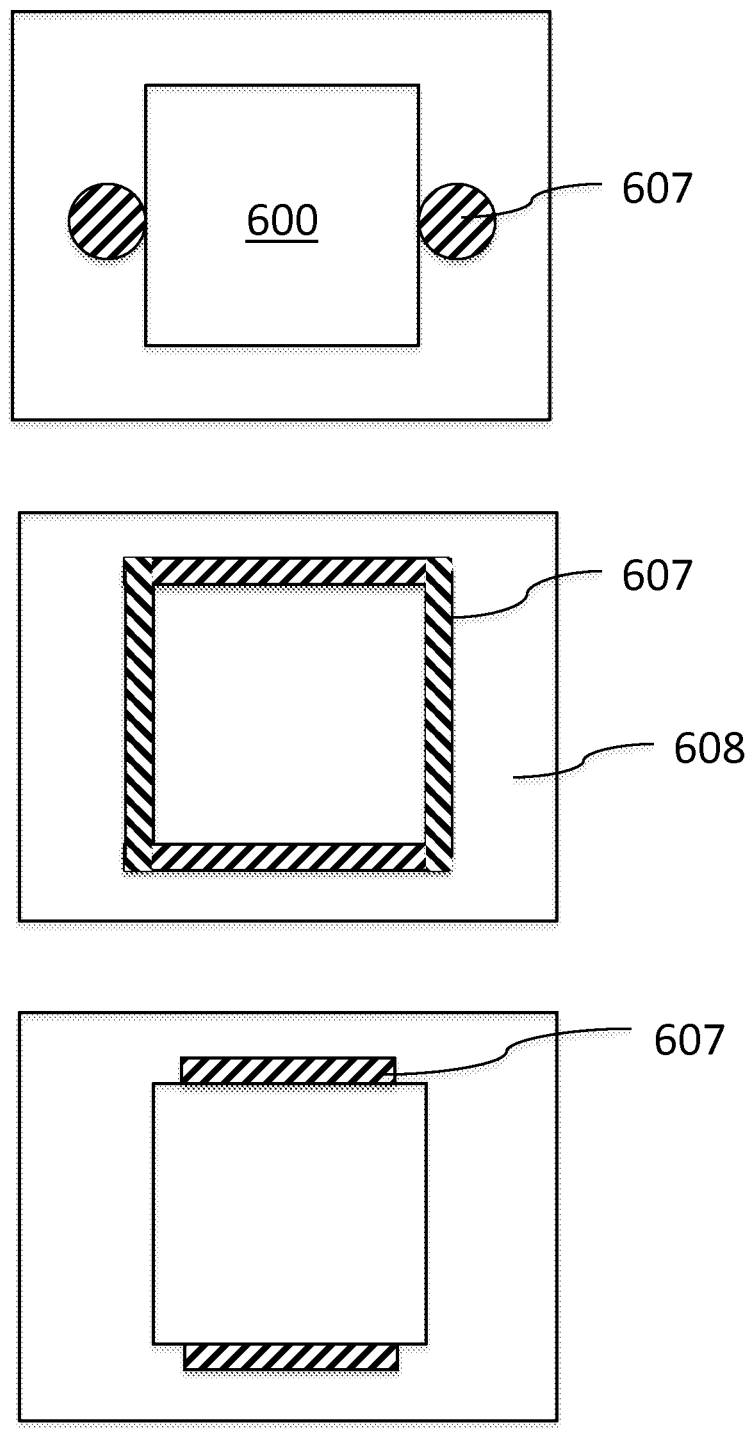
FIG. 6 is a top view of a light-emitting device mounted on a carrier in accordance with the methods of the present invention.

The light-emitting system according to the present invention can further comprise a transparent encapsulation layer 210 (FIG. 2). It can also comprise a phosphor layer for light conversion purposes. It can also further comprise a lens for light collimation purposes, or for any other suitable purposes. The lens can be made from any suitable materials such as acrylic, PET, silicone or the like. According to the present invention, to ensure that the light-emitting device is placed in contact with a carrier, adhesive 207 (FIG. 2) is dispensed on carrier 208 in at least one spot on the perimeter of the light-emitting device (for example in two spots on the perimeter as shown in FIG. 2, or around the light-emitting device as shown in FIG. 6, where adhesive 607 is disposed on carrier 608 around the entire perimeter of light-emitting device 600, or around some portion of the perimeter as shown in FIG. 6, bottom drawing).

Figure 3:
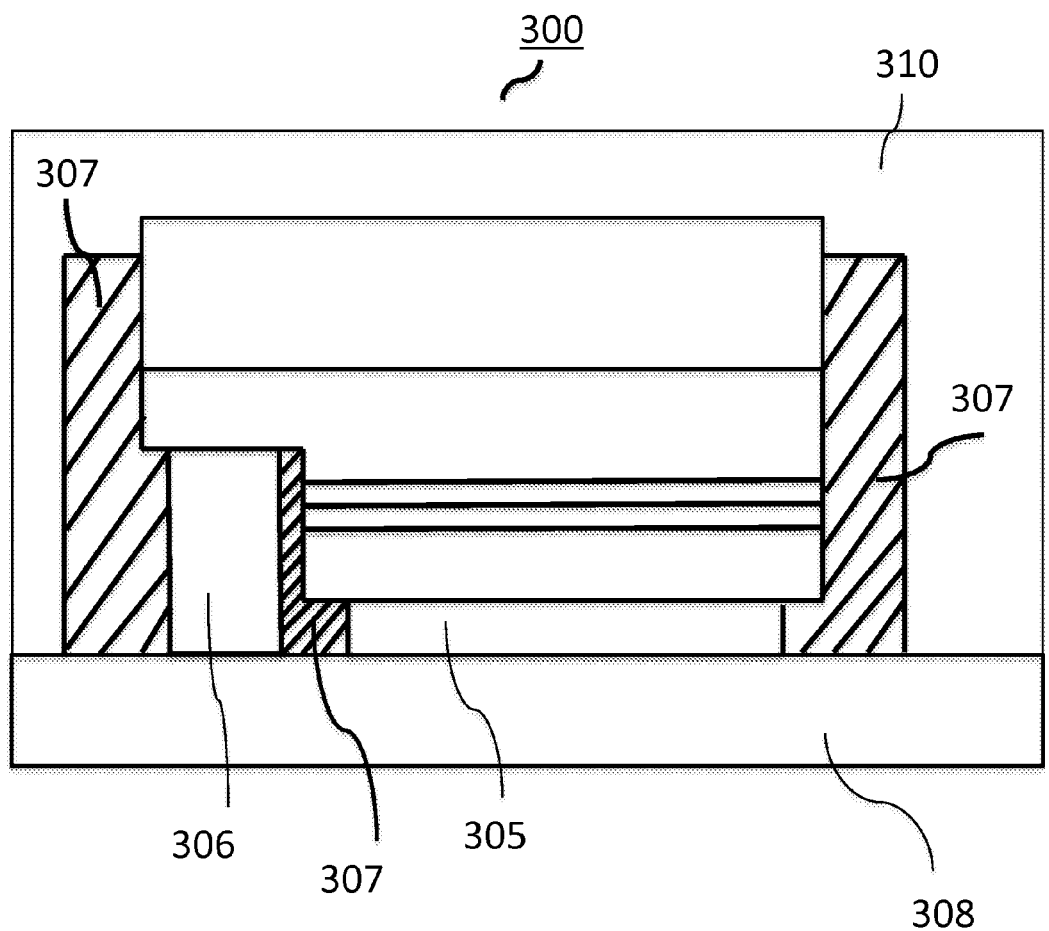
FIG. 3 is a schematic cross-section of a light-emitting system in accordance with another preferred embodiment of the present invention.

According to another embodiment of the present invention illustrated by FIG. 3, adhesive 307 is dispensed on carrier 308 not only around light-emitting device but also between p-contact layer 306 and n-contact layer 305 to fill the gap formed between these layers, or any other gaps between the light-emitting device and the carrier.

The conductive pattern/circuit of the carrier is connected to a DC or AC power source. Being in electrical communication with p-contact and n-contact of light-emitting device, the circuit functions as a means for controlling the light-emitting device, or devices of the light-emitting system (p-contact is held at a positive potential relative to n-contact, which causes electrical current to be injected into LED, as the electrical current passes through light-generating region, electrons from n-doped layer combine with holes from p-doped layer, which causes the light-generating region to generate light). The conductive pattern on the carrier can be made of conductive materials such as silver, ITO, copper, gold, platinum, or any other suitable conductive materials.

According to the present invention, the light-emitting device can be a light-emitting diode, or surface mount device (SMD), or an integrated circuit (IC), or combination thereof.

According to the present invention, suitable adhesives, preferably non-conductive adhesives, include UV-curable or time-curable cyanoacrylates, temperature-curable thermoset adhesives, with typical cure temperature from 60 degrees F. to 180 degrees F., cross-linking thermoset adhesives, temperature-curable or UV-curable silicones, solvent based or polymer adhesives such as emulsion adhesives that harden by drying, pressure sensitive adhesives, contact adhesives, e.g., 3M spray glue tack adhesive, multi part adhesives such as polyols, acrylic polymers, polyester resins, light curing adhesives (UV or sun light activated), elastomers, thermoplastics, emulsions and thermosets such as epoxies, polyurethanes, cyanoacrylates and acrylics, and the like, or mixture thereof. It was surprisingly found that eliminating solders from a light-emitting system assembly improves the reliability of the light-emitting system. Not wishing to be bound by this theory, it is contemplated that the employed by the prior art solders have different coefficient of thermal expansion than other materials such as copper for example, and upon temperature fluctuations due to changes in either ambient conditions or the power dissipated by the circuit, these materials will expand differently, leading to the creation of stresses, and resulting in warping or solder joint fractures.

The transparent encapsulation layer is suitably selected from silicone, acrylics, polyethylene terephthalate (PET), or clear plastic, glass, thermosets, triacetyl cellulose, and the like, or mixture thereof. Transparent encapsulation layer can have an index of refraction of 2.0 or higher and transparency of 70% or higher.

The carrier is preferably selected from materials such as polyethylene terephthalate (PET), glass, copper, aluminum, or other application-dependent suitable materials.

Figure 7:
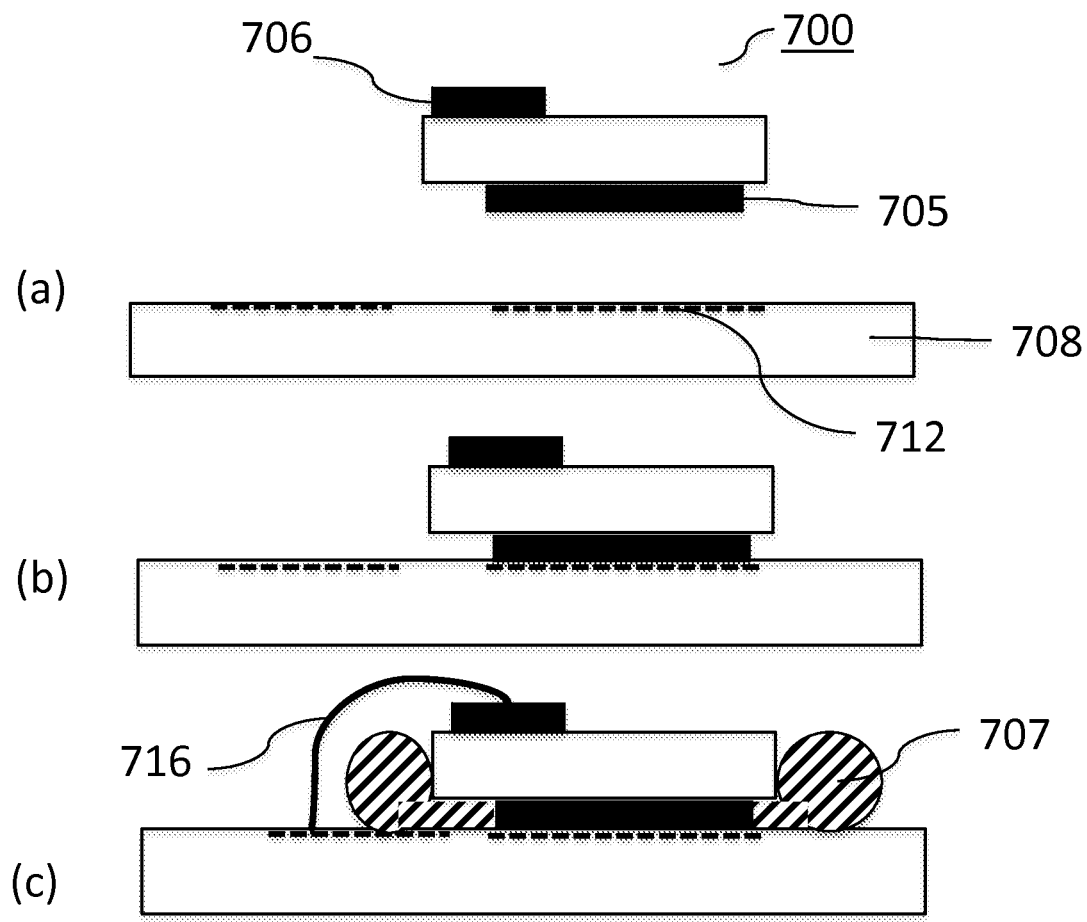
FIG. 7 illustrates a method of fabricating a light-emitting system comprising a vertically aligned light-emitting device in accordance with the methods of the present invention.

In accordance with the present invention, the light-emitting device can be a vertically aligned device, a device having a p-contact layer and n-contact layer being disposed on the opposite sides of the light-emitting device. For example, as shown in FIG. 7, p-contact layer 706 can be disposed on the top side (the side from which the light is emitted) of light-emitting device 700 the n-contact layer 705 is being disposed on the opposite (bottom) side of light-emitting device 700 facing carrier 708. Conversely, the n-contact layer can be disposed on the top-side (the side from which the light is emitted) of the light-emitting device and the p-contact layer is being disposed on the opposite (bottom) side of the light-emitting device.

Figure 4:
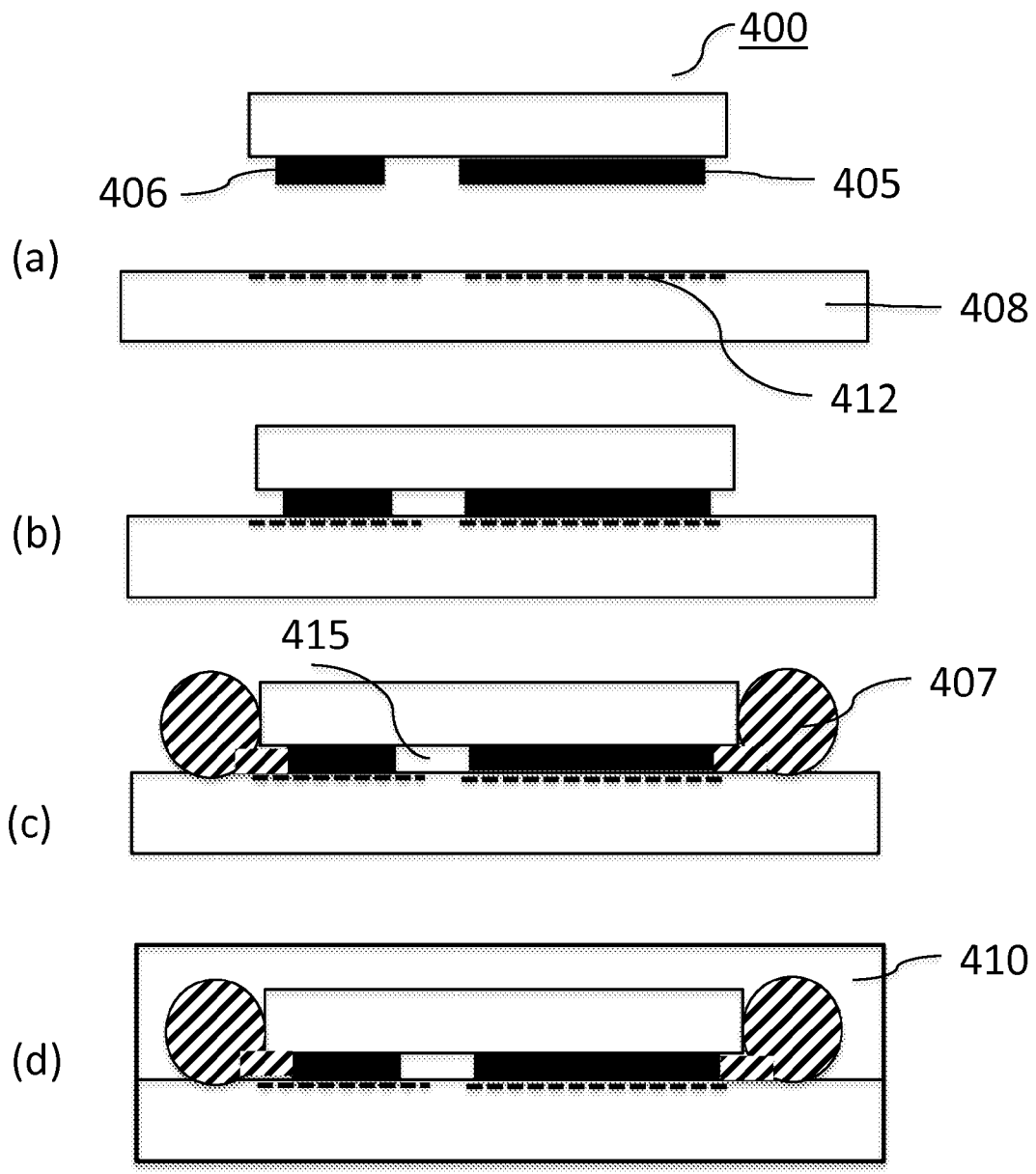
FIG. 4 illustrates a method of fabricating a light-emitting system in accordance with one embodiment of the present invention.

FIG. 4 illustrates the method of making a light-emitting system. Carrier 408 with conductive patterns/circuitry 412 is provided (step a) for placing thereon light-emitting device 400 having p-contact layer 406 and n-contact layer 405 on the same, bottom side of light-emitting device 400. Light-emitting device 400 is then placed on carrier 408 in such a way as to make p-contact layer 406 and n-contact layer 405 in direct contact with the corresponding conductive patterns/circuitry 412 on carrier 408 (step b). Adhesive 407 is then dispensed on carrier 408 (step c), followed by the step of curing adhesive 407. According to the present invention, to secure the light-emitting device on the carrier, the adhesive is dispensed in at least one spot on the perimeter of the light-emitting device (for example, in two spots as shown in FIG. 4, steps (c), or around some portion or around the entire perimeter of light-emitting device 600 as illustrated in FIG. 6, top view of light-emitting device 600 attached to carrier 608 with adhesive 607. The adhesive can also be dispensed between contact layers 406 and 405 to fill gap 415 formed between these layers, or also to fill any other gaps formed between light-emitting device 400 and carrier 408.

Then mounted on carrier 408 light-emitting device 400 is encapsulated with transparent encapsulation layer 410 as shown in FIG. 4, step (d). The phosphor layer can be deposited on top of transparent encapsulation layer 410 for light conversion purposes, for example to convert blue light emitted by Blue light-emitting device into white light. The phosphor layer can be deposited before encapsulating the light-emitting device with the transparent encapsulation layer, or alternatively can be mixed with the transparent encapsulation layer and deposited as one combined layer. Optionally, a lens can be formed on top of the light-emitting device for light collimation purposes, for example. The lens can be formed on the transparent encapsulation layer, or on the phosphor layer.

After placing the light-emitting device on the carrier, some downward force can be applied to the light-emitting device prior to dispensing the adhesive to ensure that the light-emitting device does not shift thereby causing misalignment between the contact layers of the device and conductive pattern/circuitry on the carrier.

The light-emitting device can be a light-emitting diode, or a surface mount device (SMD), or an integrated circuit (IC), or their combination. More than one light-emitting device can be mounted on the carrier to form an array of light-emitting devices (for example, two, three, or more light-emitting devices can be mounted on the carrier).

Before curing the adhesive, the voltage can be applied for a short period of time to the light-emitting device to light it up to ensure its functionality.

Figure 5:
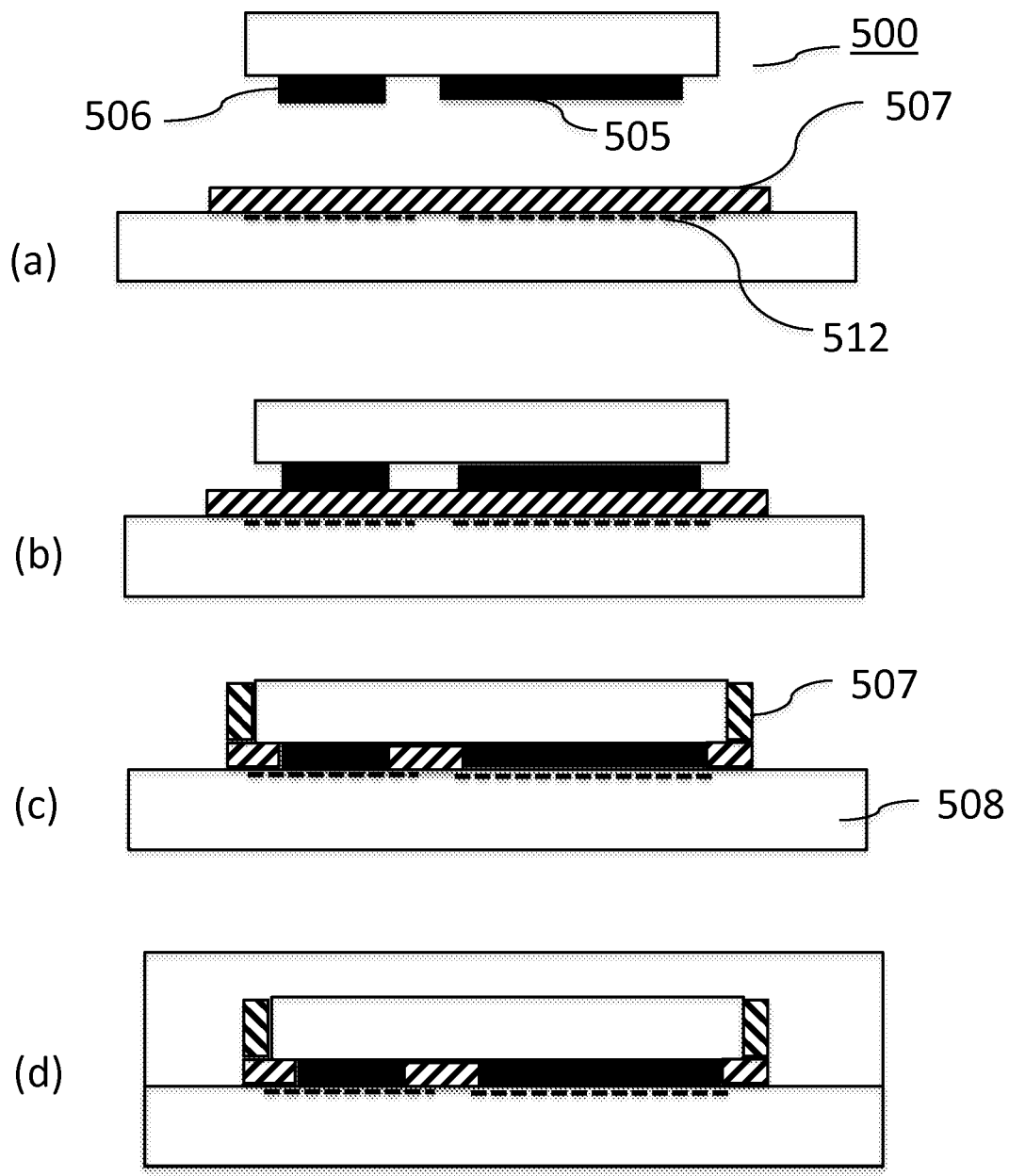
FIG. 5 illustrates a method of fabricating a light-emitting system in accordance with another preferred embodiment of the present invention.

According to another preferred method of fabricating a light-emitting system, as illustrated in FIG. 5, adhesive 507 is dispensed on carrier 508 first, covering substantial portion of the surface of carrier 508 (including covering conductive patterns/circuitry 512), step (a), then light-emitting device 500 is placed on top of adhesive 507, step (b) and pressed down by applying a downward force to the light-emitting device causing adhesive 507 to be squeezed out to the sides while filling the gap between the contact layers as shown in step (c) of FIG. 5 thereby placing p-contact layer 506 and n-contact layer 505 in direct contact with corresponding conductive patterns/circuitry 512 of carrier 508. Next, curing adhesive 507, followed by the encapsulation of light-emitting device 500 with a transparent encapsulation layer, then depositing phosphor layer, and lensing layer. The downward force can be also applied to the light-emitting device during the curing step of the adhesive.

While adhesive 507 is applied to the substantial portion of the surface of carrier 508, covering entirely conductive patterns/circuitry 512, as shown in step (a) of FIG. 5, the adhesive can be applied instead to some portion of the surface of the carrier, for example it can be dispensed as to cover only some portions of conductive patterns/circuitry 512, or it can be dispensed on some portions of the surface of the carrier while not covering conductive patterns/circuitry 512 at all.

Depending on the type of adhesive chosen, it can be cured by application of temperature, UV light, sunlight, or any other suitable means. The adhesive and the encapsulation layers can be applied using known means such as spraying, coating, dispensing from a syringe, or by any other suitable method. The light-emitting device can be placed on the carrier manually, or using pick-and-place robotic systems, or by any other suitable methods. The conductive pattern/circuitry on the carrier can be formed by application of a conductive coating, a conductive ink, copper etching process, or a conductive adhesive, using a printing method such as inkjet printing method, a laser printing method, a silk-screen printing method, and a base sheet printing method, or any other suitable method depending on the material of which the carrier is made.

One example of fabricating a light-emitting system having a vertically aligned light-emitting device is shown in FIG. 7 in accordance with one embodiment of the present invention. Light-emitting device 700 with p-contact layer 706 being disposed on the top side of light-emitting device 700 (the side from which the light is emitted) and n-contact 705 being disposed on the bottom side of light-emitting device 700 (or alternatively, n-contact layer 705 can be disposed on the top side of light-emitting device 700 and p-contact layer 706 can be disposed on the bottom side of light-emitting device 700 in a so-called "p-side down" configuration). Light-emitting device 700 is placed on carrier 708 having conductive patterns 712 disposed thereon forming a circuit to be connected to an AC or DC power source for operating light-emitting device 700 such that n-contact layer 705 (or p-contact layer 706, in case of the "p-side down" configuration) is in contact with conductive pattern 712. Then, non-conductive adhesive 707 is disposed on carrier 708 (it can be disposed in at least one spot on the perimeter of the device, or around the perimeter of the device, or around a portion of a perimeter of the device). After curing non-conductive adhesive 707, an electrical connection between p-contact layer 706 (or n-contact layer 705, in case of the "p-side down" configuration) and conductive pattern 712 of carrier 708 is established by wire-bonding 716. The device can be encapsulated with a transparent encapsulation layer, followed by applying a light converting phosphor layer, or phosphor layer can be applied first, followed by applying an encapsulation layer. In accordance with the present invention, all the described-above methods of applying the non-conductive adhesive applicable to a non-vertically aligned light-emitting device are equally applicable to a vertically aligned light-emitting device (having either "p-side down" or "n-side down" configuration). For example, non-conductive adhesive 707 can be disposed on carrier 708 first, and then light-emitting device 700 is placed on carrier 708, a downward force is applied to light-emitting device 700 to push out non-conductive adhesive 707 to form a direct contact between n-contact 705 and conductive pattern 712, followed by curing non-conductive adhesive 707. The downward force can be also applied to the light-emitting device while the non-conductive adhesive is being cured.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A light-emitting system comprising:
    at least one light-emitting device, said at least one light-emitting device comprising a p-doped region, an n-doped region, an active region disposed between said p-doped region and n-doped region, an n-contact layer disposed on the n-doped layer and a p-contact layer disposed on the p-doped layer;
    a carrier with conductive patterns disposed thereon forming a circuit for connecting to a power source for operating said at least one light-emitting device, said formed circuit being in electrical communication with the n-contact layer and p-contact layer of the light-emitting device;
    said at least one light-emitting device is mounted on said carrier with a non-conductive adhesive disposed on said carrier such that at least one of the p-contact layer and n-contact layer of the light-emitting device is in direct contact with said conductive patterns formed on said carrier; wherein said non-conductive adhesive is disposed on the carrier in the form of at least two discrete patches on the perimeter of the light-emitting device; wherein each of said discrete patches is at least one of a substantially spherical shape and a cuboid shape; and
    wherein said at least one light-emitting device is selected from the group consisting of light-emitting diode, surface mount device (SMD) package incorporating at least one light-emitting diode, integrated circuit incorporating at least one light-emitting diode, or a combination thereof.

2. The light-emitting system of claim 1 wherein said p-contact layer and said n-contact layer of said light-emitting device are disposed on the same side of the light-emitting device, on the side that is opposite the light emission surface of the light-emitting device.

3. The light-emitting system of claim 1 wherein said p-contact layer and said n-contact layer of said light-emitting device are disposed on the opposite sides of the light-emitting device.

4. The light-emitting system of claim 1 further comprising a transparent encapsulation layer.

5. The light-emitting system of claim 1 further comprising a light converting phosphor layer.

6. The light-emitting system of claim 1 wherein said non-conductive adhesive is disposed on the carrier in one patch on the perimeter of the light-emitting device.

7. The light-emitting system of claim 6 wherein said non-conductive adhesive is further disposed to fill in gaps between said at least one light-emitting device and said carrier.

8. A method of making a light-emitting system in accordance with claim 1, said method comprising:
    providing at least one light-emitting device comprising a p-doped region, an n-doped region, an active region disposed between said p-doped region and n doped region, an n-contact layer disposed on the n-doped layer and a p-contact layer disposed on the p-doped layer;
    providing a carrier with conductive patterns disposed thereon forming a circuit for connecting to a power source for operating said at least one light-emitting device;
    placing said at least one light-emitting device on the carrier in such a way as to make at least one of said p-contact layer and said n-contact layer in direct contact with the conductive patterns on the carrier;
    applying a non-conductive adhesive material on the carrier, in the form of at least two discrete patches on the perimeter of the light-emitting device, to attach the light-emitting device to the carrier; wherein each of said discrete patches is at least one of a substantially spherical shape and a cuboid shape; and curing said non-conductive adhesive material; wherein the at least one light-emitting device is selected from the group consisting of light-emitting diode, surface mount device (SMD) package incorporating at least one light-emitting diode, integrated circuit incorporating at least one light-emitting diode, or a combination thereof.

9. The method of claim 8 wherein said p-contact layer and said n-contact layer are disposed on the same side of the light-emitting device, on the side that is opposite the light emission surface of the light-emitting device.

10. The method of claim 8 wherein said p-contact layer and said n-contact layer are disposed on the opposite sides of the light-emitting device.

11. The method of claim 10 further comprising electrically connecting one of the p-contact and n-contact layer of the light emitting device to the conductive circuit on the carrier.

12. The method of claim 8 wherein applying said non-conductive adhesive material is in one patch on the perimeter of the light-emitting device.

13. The method of claim 8 further comprising disposing a transparent encapsulation layer.

14. The method of claim 8 further comprising disposing a light converting phosphor layer.

15. The method of claim 8 further comprising applying said non-conductive adhesive to fill in gaps between said at least one light-emitting device and said carrier.

16. The method of claim 8 further comprising applying a downward force to the light-emitting device prior to dispensing the non-conductive adhesive.

17. The method of claim 8 further comprising lighting up the light-emitting device by applying voltage to said device prior to curing the non-conductive adhesive to test if the device is functional.

18. A method of making a light-emitting system in accordance with claim 1, said method comprising:

providing at least one light-emitting device comprising a p-doped region, an n-doped region, an active region disposed between said p-doped region and n-doped region, an n-contact layer disposed on the n-doped layer and a p-contact layer disposed on the p-doped layer;

providing a carrier with conductive patterns disposed thereon forming a circuit for connecting to a power source for operating said at least one light-emitting device;

applying a non-conductive adhesive material in the form of at least two discrete patches on the perimeter of the light-emitting device, wherein each of said discrete patches is at least one of a substantially spherical shape and a cuboid shape;

placing said at least one light-emitting device on the carrier in such a way as to make at least one of said p-contact layer and said n-contact layer in direct contact with the conductive patterns on the carrier;

and curing said non-conductive adhesive material; wherein the at least one light-emitting device is selected from the group consisting of light-emitting diode, surface mount device (SMD) package incorporating at least one light-emitting diode, integrated circuit incorporating at least one light-emitting diode, or a combination thereof.

19. The method of claim 18 further comprising applying a downward force to the light-emitting device after placing the light-emitting device on the carrier.

20. The method of claim 19 wherein applying the downward force to the light-emitting device is further conducted while the adhesive is being cured.

21. The method of claim 18 wherein said non-conductive adhesive material is applied to cover some portions of said conductive patterns.

22. The method of claim 18 wherein said non-conductive adhesive material is applied to cover some portions of said carrier without covering said conductive patterns.

* * * * *